United States Patent [19]

Katahara

[11] Patent Number: 4,949,316
[45] Date of Patent: Aug. 14, 1990

[54] ACOUSTIC LOGGING TOOL TRANSDUCERS

[75] Inventor: Keith W. Katahara, Allen, Tex.

[73] Assignee: Atlantic Richfield Company, Los Angeles, Calif.

[21] Appl. No.: 405,918

[22] Filed: Sep. 12, 1989

[51] Int. Cl.$^5$ .......................... G01V 1/40; H01L 41/08
[52] U.S. Cl. .................................... 367/157; 367/158; 367/113; 367/912; 310/334; 310/337; 381/173
[58] Field of Search ............... 367/157, 158, 163, 912; 310/337, 333, 334, 353; 381/173, 179

[56] References Cited

U.S. PATENT DOCUMENTS

| | | | |
|---|---|---|---|
| 2,912,605 | 11/1959 | Tiffetts | 310/333 |
| 3,215,977 | 11/1965 | Williams et al. | 367/158 |
| 3,360,664 | 12/1967 | Straube | 310/337 |
| 3,363,118 | 1/1968 | Sims | 310/8.7 |
| 3,593,255 | 7/1971 | White | 340/15.5 |
| 3,614,486 | 10/1971 | Smiley | 310/8.2 |
| 3,786,894 | 1/1974 | Lebreton | 181/0.5 BE |
| 3,877,296 | 4/1975 | Rihn | 367/176 |
| 3,903,435 | 9/1975 | Bouygues et al. | 310/8.1 |
| 4,004,267 | 1/1977 | Mayne | 340/15.5 TA |
| 4,072,871 | 2/1978 | Wilson | 310/333 |
| 4,319,345 | 3/1982 | Dennis | 367/25 |
| 4,395,908 | 8/1983 | Shepherd | 367/163 |
| 4,408,832 | 10/1983 | Hartman et al. | 350/310 |
| 4,415,998 | 11/1983 | Blizard | 367/25 |
| 4,435,666 | 3/1984 | Fukui et al. | 310/328 |
| 4,506,154 | 3/1985 | Scire | 250/442.1 |
| 4,518,887 | 5/1985 | Yano et al. | 310/328 |
| 4,606,014 | 8/1986 | Winbow et al. | 367/157 |
| 4,644,213 | 2/1987 | Shibuya | 310/328 |
| 4,647,808 | 3/1987 | Shibuya | 310/328 |
| 4,649,525 | 3/1987 | Angona et al. | 367/31 |
| 4,649,526 | 3/1987 | Winbow et al. | 367/35 |
| 4,675,568 | 6/1987 | Vchikawa et al. | 310/328 |
| 4,682,308 | 7/1987 | Chung | 367/31 |
| 4,700,100 | 10/1987 | Congdon et al. | 310/332 |
| 4,700,803 | 10/1987 | Mallett et al. | 181/106 |
| 4,706,230 | 11/1987 | Inoue et al. | 310/334 |
| 4,715,019 | 12/1987 | Medlin et al. | 367/31 |
| 4,718,046 | 1/1988 | Medlin | 367/31 |

FOREIGN PATENT DOCUMENTS

| | | | |
|---|---|---|---|
| 0264323 | of 0000 | European Pat. Off. | |
| 0246773 | 11/1987 | European Pat. Off. | |
| 57-187980 | 11/1982 | Japan | |
| 0210171 | 10/1985 | Japan | 310/328 |
| 0535114 | 11/1976 | U.S.S.R. | 310/328 |
| 2122351A | 1/1984 | United Kingdom | |
| 2124377A | 2/1984 | United Kingdom | |

OTHER PUBLICATIONS

"A Theoretical Study of Acoustic S-Wave and P-Wave Velocity Logging", G. A. Winbow; Geophysics: vol. 53, No. 10, Oct. 1988; pp. 1334–1342.

"Continuous Acoustic Shear Wave Logging"; J. Zemanek et al; Paper U; SPWLA Twenty-Fifth Symposium; Jun. 1984.

"New Ways to Make Shear Waves"; The Technical Review, vol. 53; No. 3, pp. 12–13.

"Piezo Stroke Amplifier"; Sakman; IBM Technical Disclosure Bulletin; vol. 20, No. 6; Nov. 1977; p. 2263.

Primary Examiner—Nelson Moskowitz
Attorney, Agent, or Firm—Michael E. Martin

[57] ABSTRACT

Electrical signal-receiving transducers for logging tools include a silicon plate having piezoresistors formed thereon and response to deflection caused by pressure waves acting on said plate to generate an electrical signal through a bridge circuit including balancing resistors. Another embodiment of the transducer comprises a curved plate which is supported in a tool cavity for response to a pressure wave to deflect and exert forces on a piezoelectric element to generate a signal proportional to the deflection and a pressure wave causing such deflection. Monopole and quadrupole arrangements of the curved plate may be used for sensing or generating symmetric and asymmetric wave forms.

16 Claims, 5 Drawing Sheets

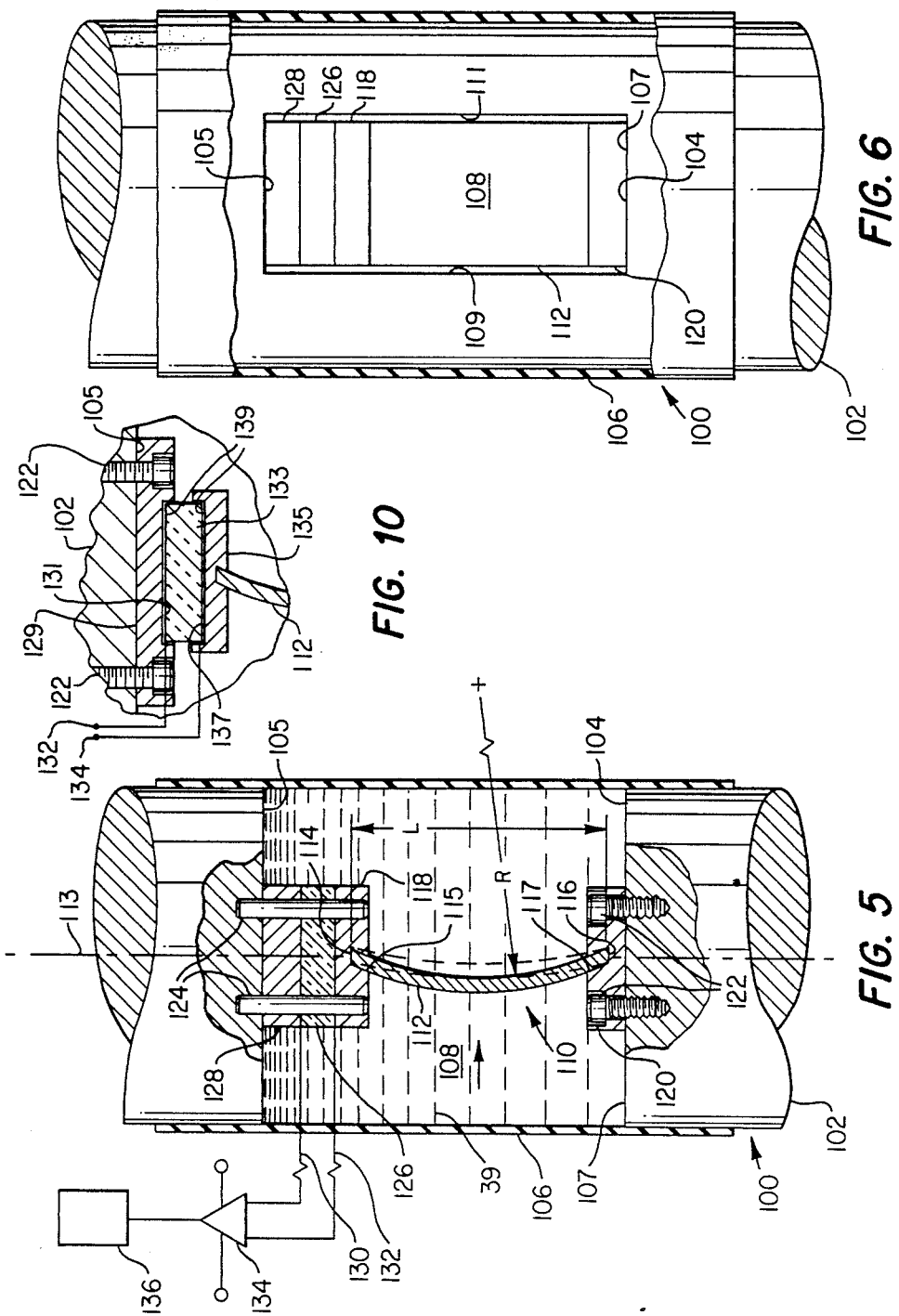

ACOUSTIC LOGGING TOOL TRANSDUCERS

BACKGROUND OF THE INVENTION

1. Field of the Invention

The present invention pertains to acoustic logging tool transducers particularly adapted as signal receiving transducers which utilize piezoelectric or piezoresistive elements.

2. Backqround

Several acoustic logging tools have been developed with a view to improving the sensitivity of the signal-transmitting and -receiving transducers and with a view to developing tools which are capable of sending and receiving compressional waves and so-called shear waves. U.S. patent applications Ser. No. 07/300,010, filed Jan. 23, 1989 in the name of Keith W. Katahara et al, Ser. No. 07/319,607, filed Mar. 6, 1989 in the name of Keith W. Katahara, Serial No. 07/353,067 filed May 17, 1989 in the name of Steven G. Petermann et al, and Ser. No. 07/363,660, filed June 8, 1989 in the name of Keith W. Katahara, all assigned to the assignee of the present invention, disclose certain piezoelectric actuators and transducers for use with acoustic logging tools. Certain references are cited by the applicant in these applications and which comprise the prior art of which the Applicant in this application is aware and which may be considered to be relevant to the subject matter of this application. These references are U.S. Pat. Nos. 3,593,255; 4,319,345; 4,649,525; 4,649,526; 4,682,308; 4,715,019; 4,718,046; British Patent Applications Nos. 2,122,351 and 2,124,377 to Exxon Production Research Company; and European Patent Publication No. 0,246,773 to Mobil Oil Corporation.

The above-mentioned patent applications describe various types of transducers including piezoelectric types which are particularly useful as signal-transmitting devices for imparting an acoustic wave into a fluid-filled borehole for transmission to and through the earth formation surrounding the borehole and whereupon return signals from the earth formation are sensed by transducers in a logging tool which may be similar to the transducers disclosed in the referenced applications. However, generally speaking, the acoustic logging tools and transducers described in the aforementioned applications are suited more for signal transmitting or signal generating devices than for signal receiving devices. In view of the energy losses from pressure wave signals when transmitted through borehole fluids and earth formations, the sensitivity of the receiving transducer is particularly critical. It is toward this end that the present invention has been developed with a view to providing signal-receiving transducers which offer superior sensitivities, thus being able to detect small amplitude borehole acoustic waves, and further, in particular, so-called shear-type acoustic waves.

SUMMARY OF THE INVENTION

The present invention provides improved acoustic logging tool transducers, particularly suited for use as signal-receiving transducers for converting an acoustic wave-type signal transmitted through a borehole fluid to an electrical signal.

In accordance with one important aspect of the present invention there is provided an acoustic signal-receiving transducer employing so-called piezoresistive elements which is particularly sensitive and which enjoys a relatively wide frequency bandwidth or range in which the transducer is sensitive. In accordance with another aspect of the present invention there is provided a logging tool transducer which utilizes piezoresistive elements for detecting an acoustic wave being propagated through a fluid medium. In one embodiment of the invention a flexible plate member is provided which responds to acoustic pressure waves to deflect and to change the resistance of a piezoresistive element forming part of the plate member.

In accordance with yet another aspect of the present invention there is provided an embodiment which is adapted for use as an acoustic signal-receiving element and which comprises a curved signal-receiving plate member which reacts to pressure forces to exert a highly leveraged actuating force against an element of piezo-electric material and which can be highly sensitive to low-amplitude signals. The signal-receiving transducers of the present invention can be made relatively compact, requiring little space in a tool which is adapted for insertion in boreholes. The curved plate elements are particularly adapted for use as monopole or quadrupole as well as higher order multipole configurations of signal-receiving and signal-generating transducers.

Those skilled in the art will recognize further advantages and superior features of the present invention upon reading the detailed description which follows in conjunction with the drawing.

BRIEF DESCRIPTION OF THE DRAWING

FIG. 5 is a central longitudinal view of a portion of a logging tool showing a piezoelectric transducer in accordance with the present invention;

FIG. 6 is a view taken from the line 6—6 of FIG. 5;

FIG. 10 is a detail section view of another embodiment of a transducer of the present invention.

DESCRIPTION OF PREFERRED EMBODIMENTS

Figures 1, 7:
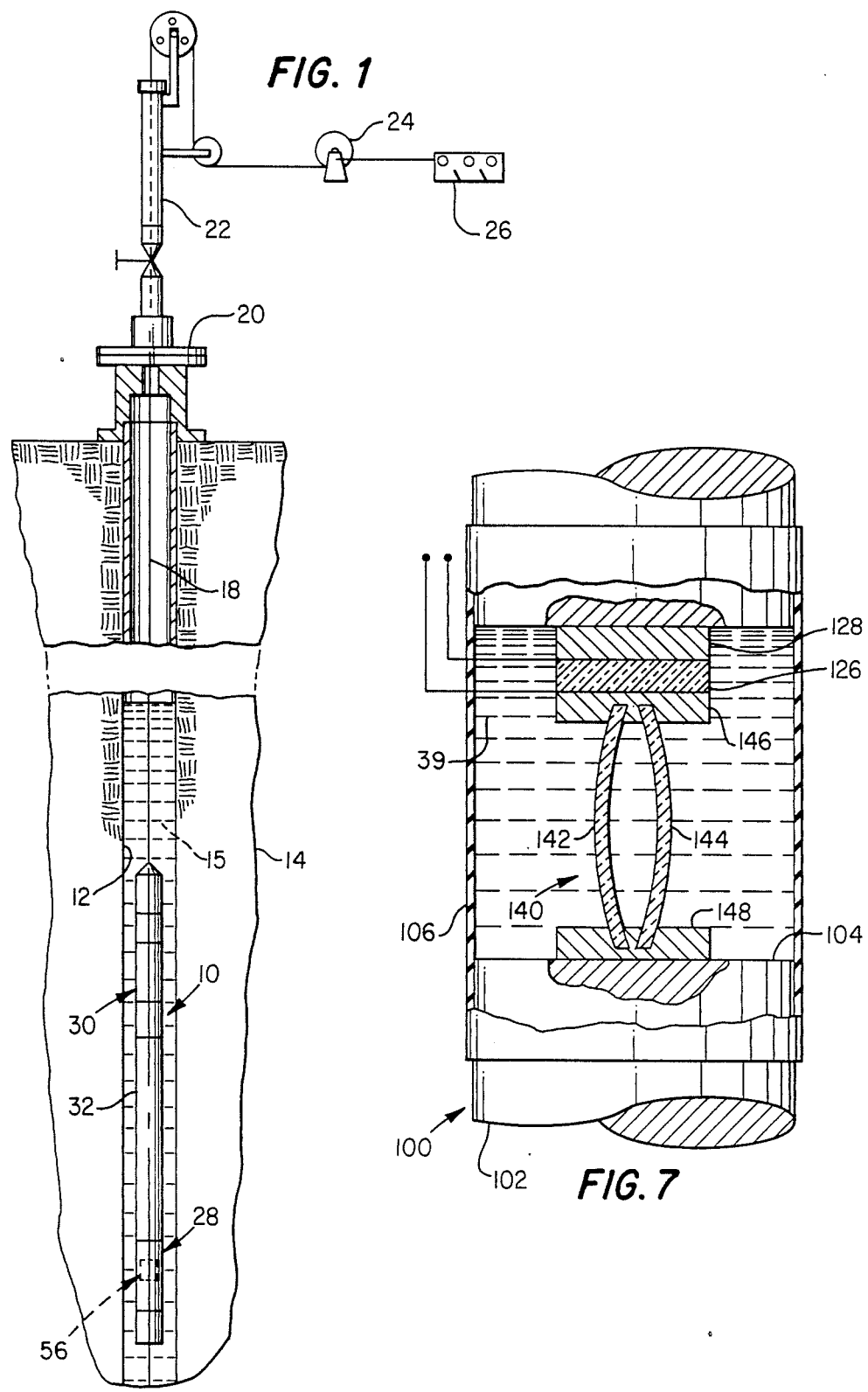
FIG. 1 is a vertical central section view in somewhat schematic form of a logging tool disposed in a borehole and utilizing the transducer of the present invention.
FIG. 7 is a view similar to FIG. 5 showing a monopole signal-generating or -receiving transducer.

In the description which follows, like parts are marked throughout the specification and drawing with the same reference numerals, respectively. The drawing figures are not necessarily to scale and certain features are shown in somewhat schematic or simplified form in the interest of clarity and conciseness.

Referring to FIG. 1 there is shown a somewhat schematic illustration of an acoustic logging tool, generally designated by the numeral 10, which is disposed in a wellbore 12 penetrating an earth formation 14. The logging tool 10 is of a type which is adapted for generating and receiving acoustic signals which are transmitted from the tool 10 to the formation 14 through a fluid medium 15 which fills the borehole, at least the portion occupied by the tool during its operation. The transmitted signals are propagated through the formation 14 and reflected back to the borehole through the fluid medium 15 for receipt by other transducers mounted on the tool. The tool 10 is typically suspended in the wellbore by an elongated cable or wireline 18 which extends from a conventional wellhead 20, through a wireline lubricator 22 and is trained over a suitable drum or reel 24. Electrical signals are transmitted between the tool 10 and a control unit 26 by way of the cable 18 in a conventional manner. The tool 10 is typically arranged to have an acoustic signal receiving section 28 and an acoustic signal transmitting section 30 which are spaced apart on a tool body 32. Although the present invention is directed to elements which are primarily adapted as signal-receiving transducers, at least one embodiment of the invention may also be utilized as a signal-transmitting element or transducer.

Figure 2:
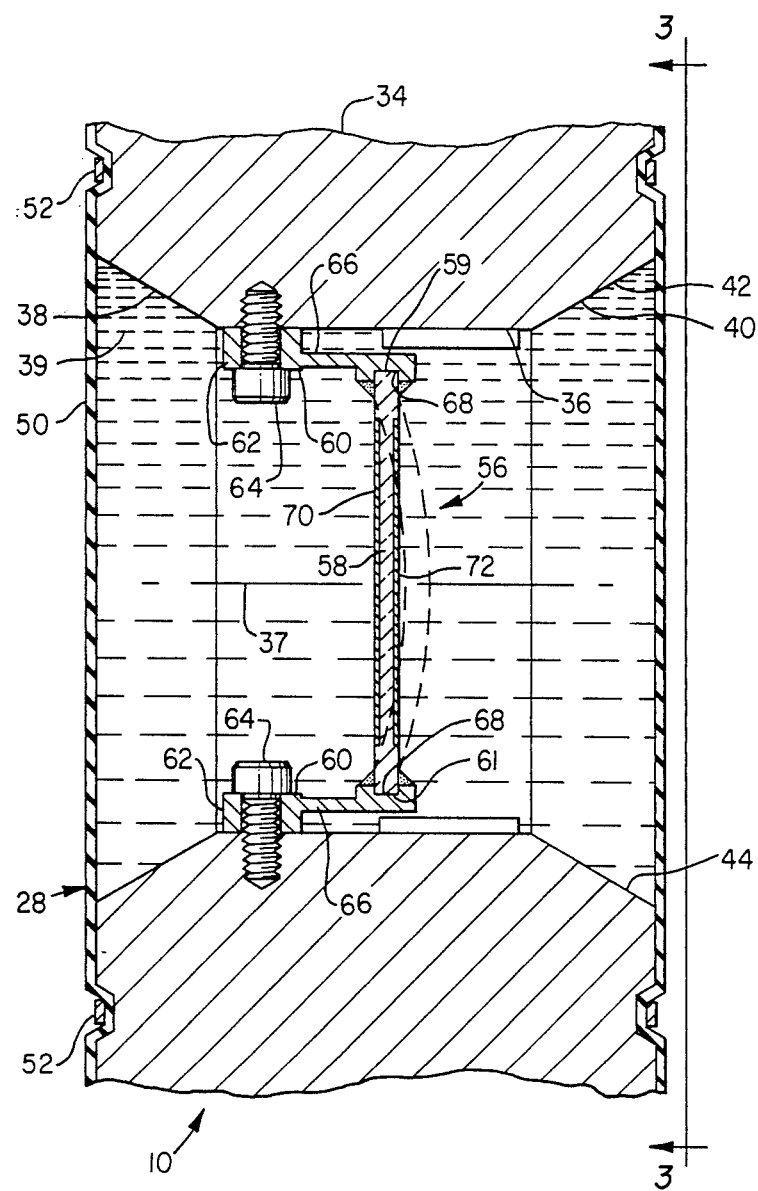
FIG. 2 is a central longitudinal section view on a larger scale of one embodiment of a logging tool transducer.
Figure 3:
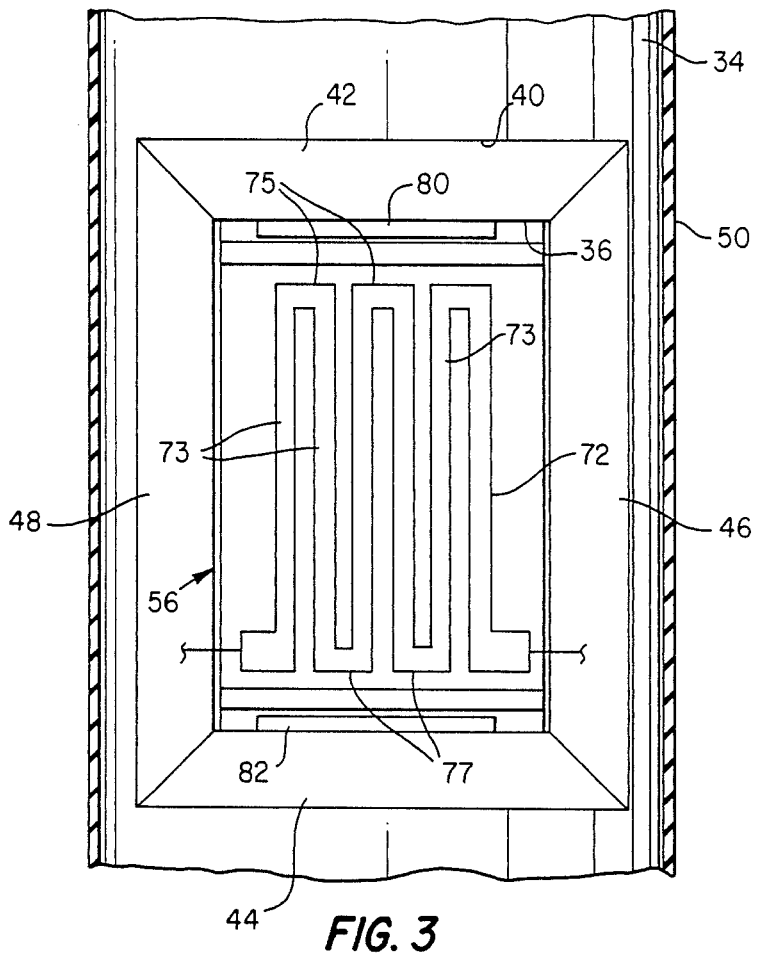
FIG. 3 is a view taken generally from the line 3—3 of FIG. 2.

Referring now to FIGS. 2 and 3, one preferred embodiment of the invention adapted as a signal-receiving transducer is disposed in the signal-receiving section 28 of tool 10. The signal-receiving section 28 includes a body member 34 having a generally rectangular-shaped, transversely-extending cavity 36 formed therein. The cavity 36 opens to opposed sloped wall cavities 38 and 40 which are formed by respective generally flat-sided wall portions, as shown by way of example for the cavity 40, by opposed sloping walls 42 and 44, FIG. 3, which extend in planes which intersect a second pair of sloping walls 46 and 48. A space defined by cavities 36, 38 and 40 is closed by a cylindrical, flexible or compliant sleeve member 50, FIG. 2, which is suitably secured to the body member 34 by spaced apart band clamps 52 or the like. The cavities 36, 38 and 40 are also typically filled with a non-conductive liquid 39 such as a mineral oil or the like.

Disposed within the cavity portion 36 is a unique piezoresistive-type signal-receiving transducer, generally designated by the numeral 56. The transducer 56 includes a rectangular, flat, plate member 58 which is preferably formed of high-purity silicon. The plate 58 is supported in the cavity 36 by opposed support members 60, each of which includes a base portion 62 secured to the housing 34 by a suitable threaded fastener 64 and a flexible arm 66, the distal end of which is provided with a slot 68 for receiving an edge 59 or 61 of the plate 58. The arm portion 66 of the support member 60 is of a relatively thin elastic material which allows the arm to flex generally inward or toward the central axis 37 of the cavity 36 in response to bending of the plate 58 in a direction generally parallel to the axis 37 due to a fluid pressure gradient imposed across it by, for example, a shear wave passing along the tool 10.

The transducer plate 58 is doped on opposed surfaces by a boron or phosphorous doping agent to provide a piezoresistive area on each side and generally designated by the numerals 70 and 72. The configuration of the piezoresistive area 72 is shown somewhat schematically in FIG. 3 and the piezoresistive area 70 may be of identical configuration. The configuration of the piezoresistance areas 70 and 72 is such that elongated legs 73 are formed which extend vertically, viewing FIGS. 2 and 3. The legs 73 are joined by relatively short and thin base portions 75 and 77.

In response to flexing of the plate 58 in the direction indicated by the dotted lines in FIG. 2, for example, due to a pressure differential on one side of the plate versus the other in the cavity 36, the piezoresistor 70 is placed in compression while the piezoresistor 72 is in tension and the resistance of the piezoresistor 72 will increase while the resistance of the piezoresistor 70 decreases. Flexing of the plate 58 in the opposite direction will, of course, reverse the degree of resistivity in the respective resistors 70 and 72. The doped areas which comprise the piezoresistors 70 and 72 are formed to a depth in the plate 58 which is relatively shallow, that is microns of an inch compared to the thickness of the plate itself. For the sake of illustration only, the piezoresistors 70 and 72 are shown as recessed areas on the surfaces of the plate 58 which may or may not be the preferred configuration.

Figure 4:
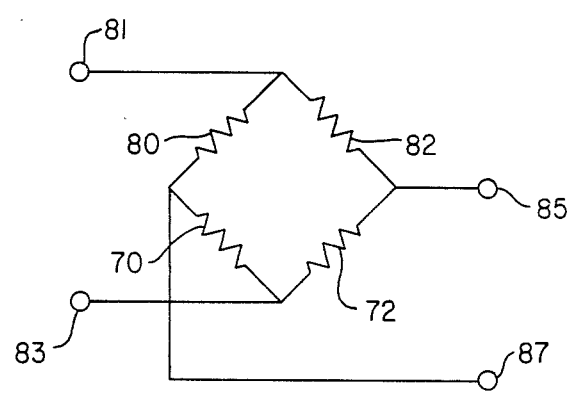
FIG. 4 is a schematic diagram of an electrical circuit including the transducer illustrated in FIGS. 2 and 3.

In order to provide a signal indicative of the degree of flexing of the plate 58, the resistors 70 and 72 are preferably placed in a bridge circuit, see FIG. 4, with essentially identical resistor elements 80 and 82. Since the piezoresistors 70 and 72 are temperature sensitive, the resistors 80 and 82 should be placed in the vicinity of the cavity 36. In fact, in the embodiment illustrated the resistors 80 and 82 may be mounted on opposed sides of the cavity 36 as illustrated in FIG. 2 and suitably electrically connected to the resistors 70 and 72 to form the circuit illustrated in FIG. 4. Referring further to FIG. 4, a suitable reference electrical potential may be applied across terminals 81 and 83 to the bridge circuit and an output potential is measured across terminals 85 and 87. This output signal may be suitably amplified and treated to provide a signal indicating the amplitude and frequency of the pressure wave which is effecting deflection of the receiver element 57.

The plate 58 should be dimensioned to have a fundamental flexural resonant frequency, when immersed in the fluid filling the cavity 36, that is within or above the frequency range of interest to be experienced in operation of the tool 10. The plate 58 should be as thin as possible to insure relatively good frequency bandwidth capability and sensitivity to low-amplitude signals. Although other semiconductor materials may be considered for the transducer 56 silicon is probably a preferred choice on the basis of its low density, high flexural modulus, availability and cost. Moreover, an array of several elements similar to the plate 58 with differing thicknesses or thickness to length ratios might be provided as a multiple array of transducers to provide broader frequency band coverage.

It is contemplated that the transducer plate 58 may be relatively small, on the order of approximately 1.0 inches long by about 0.10 inches thick to provide for mounting in a relatively small-diameter logging tool and which may still be provided with the shaped cavity portions 38 and 40 which are capable of concentrating acoustic wave energy to impinge on the transducer 56. Moreover, the transducer 56 does not require to be rectangular in configuration. For instance, a circular-disk-type transducer might be employed with radially extending piezoresistive strips or legs similar to the configuration of the piezoresistors 70 and 72. Such a transducer might be mounted in a manner similar to the mounting of the transducer elements described in the aforementioned patent application Ser. No. 07/300,010. The transducer described above is sensitive only to differential pressures across the body of the logging tool 10 and is suited to detect dipole flexural acoustic waves in the wellbore 12. Combinations of such transducers can be arranged to detect compressional or monopole waves as well as quadrupole and waves of higher order symmetry.

Still further advantages of the transducer 56 are realized with the arrangement of the supporting structure including the support members 60 which, with the living hinge feature of the respective arms 66, allows the plate 58 to flex with little horizontal displacement at the opposed edges 59 and 61. Since the hinge portions formed by the arms 66 are allowed to flex generally vertically, viewing FIG. 2, but are relatively rigid in tension and compression, there is little horizontal displacement at the edges of the transducer plate 58. The arrangement of the transducer 56 in the tool 10 is particularly advantageous in that an improved transducer for logging tools is provided which is mechanically uncomplicated and requires well-known, uncomplicated semiconductor-type fabrication techniques. Moreover, the associated electrical circuitry for generating a signal with respect to the mechanical displacement of the transducer is uncomplicated and believed to be novel in the art of logging tool transducers.

Referring now to FIGS. 5 and 6 an alternate embodiment of the present invention which utilizes piezoelectric elements is illustrated. FIGS. 5 and 6 illustrate a vertical central section view and a vertical side elevation of a tool 100 similar to the tool 10 and having a body member 102 having a generally rectangular transverse slot 104 formed therein. A compliant flexible sleeve 106 is disposed around and secured to the body member 102 to form a cavity 108 which is filled with a suitable liquid similar to the cavity formed in the tool 10. An acoustic signal-receiving transducer 110 is disposed in the cavity 108 and is characterized by a generally rectangular curved plate member 112 which is supported at opposite lateral sides 114 and 116 in opposed support members 118 and 120, respectively. The support member 120 is secured to the body member 102 within the cavity 108 by conventional threaded fasteners 122. The support member 118 is also secured against lateral movement relative to the body member 102 by dowel pin type fasteners 124. However, the support member 118 is disposed contiguous with a piezoelectric element 126 which is interposed between the support member 118 and a second support member 128. The members 118 and 128 are preferably formed of an electrically nonconductive material or have interposed between themselves and the piezoelectric element 126 an insulating gasket, not shown. As illustrated in FIG. 6, the configuration of the plate 112, the support members 120, 124 and 128 and the piezoelectric element 126 are such as to substantially fill the cavity 108 between opposed sidewalls 109 and 111. In this way a differential pressure pulse transmitted to the cavity 108 by way of the compliant sleeve 106 will impinge on the plate 112 to deflect the plate to either increase or decrease the curvature of the plate depending on whether the fluid pressure increases from right to left or from left to right, viewing FIG. 5. Such flexing of the plate 112 will cause forces acting on the element 126 to decrease or increase, respectively, thereby generating an alternating current electrical signal which may be conducted by way of conductors 130 and 132 to an amplifier 134. An electrical signal output from the amplifier 134 is conducted to further circuit means 136.

The piezoelectric element 126 is, of course, polarized to provide a signal when subjected to compressive forces acting thereon and exerted between the support members 118 and 128 by the plate 112. The plate 112 is preferably of a relatively rigid material and the curvature shown is preferably rather small, that is a rather large radius of curvature. The plate length L is preferably in the range of about one-tenth or less of the radius of curvature R, see FIG. 5. The length L is shown for the curved condition of the plate 112 although the uncurved or planar length would not be significantly greater. The plate 112 is disposed in respective slots 115 and 117 formed in the support members 118 and 120. These slots 115 and 117 are preferably formed at an angle to predispose the plate 112 to the curvature illustrated. The transducer 110 is preferably supported in the cavity 104 between top and bottom walls 105 and 107 in a precompressed condition of the piezoelectric member 126. The fasteners 124 retain the support members 118 and 128 and the piezoelectric element 126 in assembly with each other against lateral movement but permit extension or contraction of the element 126 in the vertical direction and parallel to axis 113, viewing FIG. 5.

Referring briefly to FIG. 10, an alternate embodiment of a support arrangement for the plate 112 is illustrated. In the arrangement of FIG. 10, a support member 129 is secured to the body 102 by suitable threaded fasteners 122. The support member 129 is provided with a recess 131 for supporting a piezoelectric element 133 against lateral movement with respect to the body member 102. A second support member 135 is also provided with a recess 137 for receiving a portion of the element 133. The support member 135 supports the plate 112 in the same manner as the support member 118. A suitable adhesive 139 may be disposed in the recesses 131 and 137 between the element 133 and the respective support members. The arrangement illustrated in FIG. 10 also permits axial extension or compression of the element 133 while precluding any lateral movement of the element with respect to the body 102.

As previously mentioned, the transducer 110 is in communication with borehole fluid by way of the sleeve 106 and liquid filling the cavity 108. A direct dipole shear wave will produce a horizontal pressure gradient across the diameter of a borehole in which the tool 100 may be disposed. Accordingly, if the transducer 110 is properly oriented, a significant net pressure difference will be sensed across the plate 112 which is converted to an axial vertical force imposed on the element 126 and a corresponding electrical potential is generated by the element 126 and amplified by the amplifier circuit illustrated. The generous radius of curvature of the plate 112 produces a large mechanical advantage such that a relatively small pressure differential across the plate 112 develops a relatively large vertical axial force acting on the element 126.

The curvature of the plate 112 is provided to also distinguish pressure gradients which are positive as well as negative. In other words, a pressure gradient tending to bend the plate 112 further may be sensed by relaxing the precompression on the element 126 which also is reflected by a signal to the amplifier 134. Precompression of the element 126 is advantageous because it reduces mechanical looseness in the transducer assembly and hysteresis in the characteristics of the output signal from the piezoelectric element 126. It is preferable that the plate 112 be rigid enough such that the flexural resonance frequency is at or above the highest frequency of interest. Moreover, the length of the plate 112 should be on the order of half of the shortest wave length of an acoustic pressure wave that is necessary for detection by the transducer 110. The transducer 110 is also dictated in regard to its size, especially width, by the diameter of the tool 100. The plate 112 can, of course, be made of any reasonably stiff material such as steel.

A charge amplifier, not shown, may be electrically connected to the piezoelectric element 126, the size and shape of the element are not important since the electrical charge developed across the opposed faces of the element which are in engagement with the respective support members 118 and 128 is dependent only on the force applied to the element 126, the dielectric constant and piezoelectric constant of the element 126.

The thickness of the element 126 is important for reducing its fragility and to develop a higher output signal for a given mechanical deflection. A stack of separate piezoelectric elements may not be advantageous because the bonds between the elements are a source of signal losses and hysteresis. The element 126 may have a thickness of about 1 cm. maximum so that it can be polarized by conventional techniques. The material used for the element 126 may be a lead zirconate titanate material. Lead metaniobate also has superior sensitivity for an application such as the element 126 but may not be suitable for applications subjected to high ambient pressure conditions such as are experienced in wellbores.

Those skilled in the art will appreciate from the foregoing description that the transducer 110 is relatively uncomplicated, can be highly sensitive and a reasonable signal frequency bandwidth may be obtained. The arrangement of the transducer 110 is also relatively compact and attractive for use in logging tools. One advantage that the transducer 110 enjoys is that it may also be used as a signal-transmitting transducer. That is, if an electrical signal is imposed on the element 126 it may expand in a vertical direction to deflect the plate 112 and provide a pressure wave signal which may be transmitted through the fluid in the cavity 108 and the compliant sleeve 106 to the borehole fluid surrounding the tool 100. In order to obtain suitable mechanical displacements the single element 126 would probably be replaced by a stack of separate elements, each adapted to be suitably electrically charged to provide an acceptable amount of mechanical displacement.

Referring briefly to FIG. 7, there is shown an arrangement in the tool 100 of a transducer 140 having opposed plates 142 and 144 which are similar to the plate 112 and mounted in support members 146 and 148 similar to the support members 120 and 118, respectively. A piezoelectric element 126 is interposed between the support member 146 and the support member 128. The arrangement of the transducer 140 provides a monopole signal-receiving or -transmitting type transducer. The plates 142 and 144 may be mounted back-to-back in an outwardly concave arrangement as compared with the outwardly convex arrangement illustrated.

Figure 8:
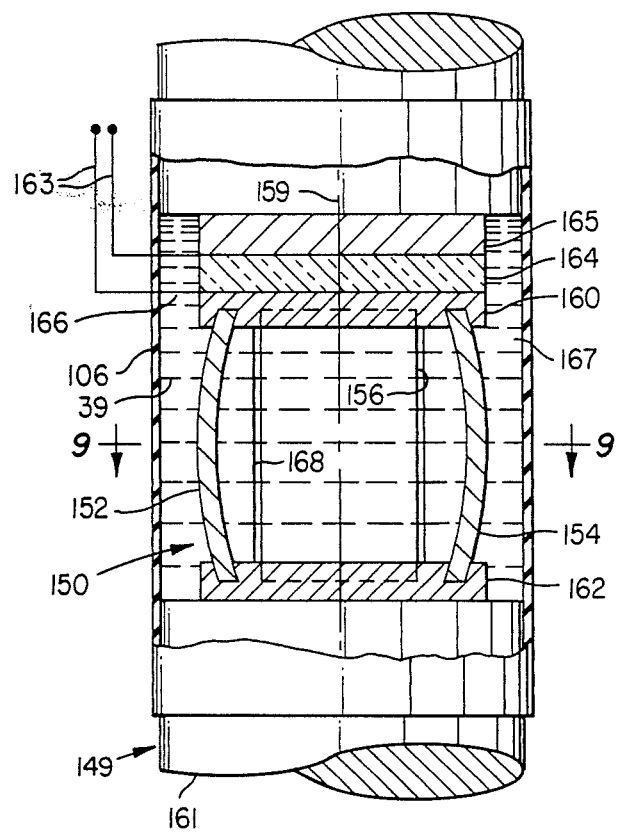
FIG. 8 is a view similar to FIGS. 5 and 7 showing a quadrupole transducer arrangement.
Figure 9:
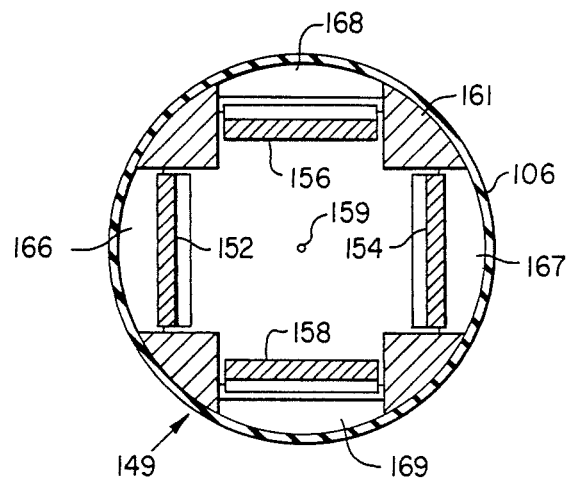
FIG. 9 is a section view taken generally along the line 9—9 of FIG. 8.

Referring now to FIGS. 8 and 9, there is illustrated yet another embodiment of a logging tool 149 having a transducer 150 with opposed curved plates 152 and 154 and a second pair of opposed plates 156 and 158, see FIG. 9, in particular. The plates 152, 154, 156 and 158 are supported in opposed support members 160 and 162, similar to the support members 118 and 120. A piezoelectric element 164, similar to the element 126 and interposed between the support member 160 and a support member 165, may be connected to a suitable source of electrical signal by way of conductors 163 to generate a quadrupole pressure wave in the borehole. As shown in FIG. 9, the plates 152 and 154 are curved outwardly while the plates 156 and 158 are curved inwardly. The tool 149 includes a body member 161 defining a liquid-filled cavity which, for the arrangement shown in FIGS. 8 and 9, includes four separate cavity portions 166, 167, 168 and 169 which provide suitable acoustic paths for the respective plates 152, 154, 156 and 158. Imposing an electrical signal across the polarized element 164 will cause the element 164 to expand axially along axis 159. Those skilled in the art will recognize that higher order, multipole configurations may also be possible utilizing the curved plate-type transducer of the present invention.

Although preferred embodiments of the present invention have been described in some detail herein, those skilled in the art will recognize that various substitutions and modifications may be made to the specific embodiments described without departing from the scope and spirit of the invention as recited in the appended claims.

What is claimed is:

1. An acoustic wave signal-receiving transducer for a logging tool, particularly adapted for sensing an asymmetric pressure wave imposed on said logging tool when said logging tool is disposed in a wellbore, said logging tool including a body member forming a cavity, said transducer being disposed in said cavity and characterized by:
   a plate member disposed in said cavity for deflection in at least one direction;
   support means for supporting said plate member in said cavity at spaced apart points on said plate member;
   a fluid in said cavity for coupling said pressure wave to said plate member; and
   a piezoresistor disposed on said plate member and responsive to deflection of said plate member to produce an electrical signal proportional to the amount of deflection of said plate member.

2. The transducer set forth in claim 1 wherein: said plate member includes opposed piezoresistors thereon.

3. The transducer set forth in claim 1 wherein: said plate member is formed of silicon and said piezoresistor is formed by doping said silicon with at least one of boron and phosphorous.

4. The transducer set forth in claim 1 wherein: said piezoresistor is disposed in a bridge-type circuit including a balancing resistor.

5. The transducer set forth in claim 4 wherein: said balancing resistor is disposed in said cavity.

6. The transducer set forth in claim 4 wherein:
   said piezoresistor includes opposed piezoresistors formed on said plate member, each of said piezoresistors having a balancing resistor in said circuit, and means for imposing an electrical potential signal across said circuit to produce an electrical potential output signal when said piezoresistors experience at least one of compression and extension in response to deflection of said plate member.

7. The transducer set forth in claim 1 wherein:
   said cavity is filled with a low-compressibility liquid and said cavity is closed by a compliant member for coupling said liquid to liquid in said wellbore.

8. The transducer set forth in claim 1 wherein:
   said support means comprises opposed support members having generally flexible arm portions formed thereon to permit flexing of said plate member in a bending mode without translation of said plate member in the direction of propagation of a pressure wave imposed on said plate member.

9. An acoustic wave signal-receiving transducer for a logging tool, particularly adapted for sensing an asymmetric pressure wave imposed on said logging tool when said logging tool is disposed in a wellbore, said logging tool including a body member forming a cavity, said transducer being disposed in said cavity and characterized by:
a plate member disposed in said cavity for deflection in at least one direction;
support means including opposed support members for supporting said plate member in said cavity at spaced apart points on said plate member and in a generally curved condition of said plate member;
a fluid in said cavity for coupling said pressure wave to said plate member wherein said plate member is responsive to said pressure wave to change its curvature; and
said support means includes a piezoelectric element responsive to deflection of said plate member to generate an electrical signal proportional to the deflection of said plate member.

10. The transducer set forth in claim 9 wherein:
the length of said plate member is about one tenth the radius of curvature of said plate member.

11. The transducer set forth in claim 9 wherein:
said piezoelectric element is connected to amplifier means for amplifying an electrical signal generated by said piezoelectric element in response to deflection of said plate member.

12. The transducer set forth in claim 9 wherein:
said support means includes opposed support member, each including slot means formed therein and oriented to bias said plate member in a curved condition when the fluid pressures in said cavity are substantially equal on opposite sides of said plate member.

13. A transducer for a wellbore logging tool and adapter to provide a pressure wave in response to an electrical signal imposed thereon, said tool including a body member having a cavity formed therein, said cavity being filled with a relatively low-compressibility liquid for coupling pressure waves between said logging tool and said wellbore, said transducer comprising:
a relatively stiff, curved plate having opposed end portions;
support means for supporting said plate in an initial, generally curved condition and for deflection from said initial condition, said support means including opposed support members disposed spaced apart on said body member for supporting said end portions of said plate, respectively; and
a piezoelectric element interposed between at least one of said support members and said body member and responsive to an electrical signal imposed thereon to deflect said plate to generate a pressure wave emanating from said cavity proportional to said electrical signal.

14. The transducer set forth in claim 13 wherein:
said transducer includes two relatively stiff plates, each having opposed end portions supported by said support members, respectively, and curved in opposite directions, one from the other, and responsive to said electrical signal to deflect to generate said pressure wave.

15. The transducer set forth in claim 12 wherein:
said transducer includes a first pair of relatively stiff plates opposed to each other and curved in opposite directions one from the other and a second pair of relatively stiff plates opposed to each other and curved in opposite directions one from the other, each of said plates having opposed end portions supported by said support members, respectively, said first and second pairs of plates being responsive to said electrical signal to generate said pressure wave.

16. The transducer set forth in claim 15 wherein:
the plates of said first pair of plates are curved outward with respect to a central axis of said tool and the plates of said second pair of plates are curved inward with respect to said axis.

* * * * *